US012759279B2

(12) United States Patent
Liao et al.

(10) Patent No.: US 12,759,279 B2
(45) Date of Patent: Oct. 13, 2026

(54) METHOD OF ALIGNING AND LAMINATING FOR PANELS AND ALIGNMENT MARK

(71) Applicant: Iris Optronics Co., Ltd., Tainan City (TW)

(72) Inventors: Chi Chang Liao, Tainan City (TW); Hou Heng Lin, Tainan City (TW); Hung Tien Chen, Tainan City (TW); Wen Fa Hung, Tainan City (TW)

(73) Assignee: Iris Optronics Co., Ltd., Tainan City (TW)

(*) Notice: Subject to any disclaimer, the term of this patent is extended or adjusted under 35 U.S.C. 154(b) by 72 days.

(21) Appl. No.: 18/939,539

(22) Filed: Nov. 7, 2024

(65) Prior Publication Data

US 2025/0353288 A1 Nov. 20, 2025

Related U.S. Application Data

(60) Provisional application No. 63/649,439, filed on May 19, 2024.

(30) Foreign Application Priority Data

Jul. 31, 2024 (TW) ................................ 113128422

(51) Int. Cl.
*B32B 38/18* (2006.01)
*B32B 7/03* (2019.01)
(Continued)

(52) U.S. Cl.
CPC ............ *B32B 38/1816* (2013.01); *B32B 7/03* (2019.01); *B32B 37/02* (2013.01); *B32B 37/18* (2013.01);
(Continued)

(58) Field of Classification Search
CPC ....... B32B 38/1816; B32B 7/03; B32B 37/02; B32B 37/18; B32B 38/1841; B32B 41/00;
(Continued)

(56) References Cited

U.S. PATENT DOCUMENTS

2010/0002183 A1 1/2010 Fukuda
2011/0001974 A1 1/2011 Harada et al.
(Continued)

FOREIGN PATENT DOCUMENTS

JP 2015-158594 A 9/2015
TW 201942689 A 11/2019

OTHER PUBLICATIONS

Yousuf Khan et al., "Mathematical Modeling of Photonic Crystal based Optical Filters using Machine Learning", 2018 International Conference on Computing, Electronic and Electrical Engineering (ICE Cube), dated on Nov. 12-13, 2018, Pakistan.

*Primary Examiner* — S. Behrooz Ghorishi
(74) *Attorney, Agent, or Firm* — CKC & Partners Co., LLC

(57) ABSTRACT

A method of aligning and laminating for panels includes forming alignment marks on each of the panels via a photomask, aligning and laminating the first panel and the second panel to form a double layer panel and aligning and laminating the double layer panel and the third panel to form a triple layer panel. The shifting mark is asymmetric to the first corner mark, the second corner mark and the third corner mark. The first corner mark and the third corner mark of the first panel are aligned to the third corner mark and the first corner mark of the second panel, respectively, and the double layer panel is formed after laminating. The second corner mark and the shifting mark of the first panel are
(Continued)

aligned to the second corner mark and the shifting mark of the third panel, respectively. The triple layer panel is formed after laminating.

11 Claims, 8 Drawing Sheets

(51) Int. Cl.

| | |
|---|---|
| ***B32B 37/02*** | (2006.01) |
| ***B32B 37/18*** | (2006.01) |
| ***B32B 41/00*** | (2006.01) |
| ***G03F 9/00*** | (2006.01) |

(52) U.S. Cl.
CPC .......... *B32B 38/1841* (2013.01); *B32B 41/00* (2013.01); *B32B 2041/04* (2013.01); *B32B 2457/202* (2013.01); *G03F 9/7069* (2013.01); *G03F 9/7073* (2013.01); *G03F 9/7088* (2013.01)

(58) Field of Classification Search
CPC .......... B32B 2457/202; B32B 2457/20; B32B 2041/04; G02F 1/1303; G02F 1/133354; G02F 1/1347; G03F 9/7069; G03F 9/7088; G03F 9/7073
See application file for complete search history.

(56) References Cited

U.S. PATENT DOCUMENTS

| | | | | |
|---|---|---|---|---|
| 2014/0092583 | A1* | 4/2014 | Franklin | G02F 1/133608 29/407.04 |
| 2015/0253580 | A1* | 9/2015 | Asakura | B32B 37/18 156/64 |
| 2016/0306273 | A1* | 10/2016 | Nam | G03F 1/42 |
| 2017/0097549 | A1* | 4/2017 | Xiong | G02F 1/133512 |
| 2018/0267352 | A1 | 9/2018 | Li et al. | |
| 2019/0107743 | A1* | 4/2019 | Hasegawa | G02F 1/133512 |
| 2020/0103681 | A1* | 4/2020 | Jung | B23K 26/032 |
| 2021/0278721 | A1* | 9/2021 | Yu | G02F 1/133512 |

* cited by examiner

METHOD OF ALIGNING AND LAMINATING FOR PANELS AND ALIGNMENT MARK

RELATED APPLICATIONS

This application claims priority to U.S. Provisional Application Ser. No. 63/649,439 filed May 19, 2024 and Taiwan Application Serial Number 113128422, filed Jul. 31, 2024, which are herein incorporated by references.

BACKGROUND

Technical Field

The present disclosure relates to a method of aligning and laminating for panels and an alignment mark. More particularly, the present disclosure relates to a method of aligning and laminating for panels and an alignment mark via the same photomask.

Description of Related Art

The color cholesterol liquid crystal display (ChLCD) is formed by stacking a plurality of single color cholesterol liquid panels, and the issue that the single color cholesterol liquid panels accurately aligned and laminated to form the ChLCD becomes important.

In particular, the clear image of the alignment marks of each of the small-sized panels can be captured via the laminating equipment by disposing the thin glass substrate. However, the thin glass substrate is not suitable for the medium-sized panels and the large-sized panels owing to the low strength thereof so as to easily cause the damage during the placement or the touch.

Furthermore, under the condition of aligning and laminating the medium-sized panels and the large-sized panels, which are not thin, the clarity of the image, which is captured via the cameras of the laminating equipment, of each of the alignment marks of the panel disposed on bottom or top is easily interfered by each of the alignment marks of the panel disposed on the middle position. Hence, the aforementioned problem is attempted to solve by the following solutions of the prior art, such as eliminating the alignment marks of the panel disposed on the middle position via the laser or the chemical agents before the laminating process, but the panels are easily damaged or polluted via the aforementioned solution; or canceling the alignment marks of the panel disposed on the middle position by modifying the photomask of the panel disposed on the middle position, but the additional investment of the expensive photomask is required via the aforementioned solution.

Therefore, a method of aligning and laminating for panels and an alignment mark, which the additional processing is not required and the pollution and the damage are avoided, needs to be developed.

SUMMARY

According to one aspect of the present disclosure, a method of aligning and laminating for panels includes forming four alignment marks on each of a plurality of the panels via a photomask, aligning and laminating the first panel and the second panel to form a double layer panel and aligning and laminating the double layer panel and the third panel to form a triple layer panel. The panels include a first panel, a second panel and a third panel, the alignment marks are located on four corners of each of the panels, respectively, the alignment marks are a first corner mark, a second corner mark, a third corner mark and a shifting mark, the first corner mark and the second corner mark are symmetrical, the second corner mark and the third corner mark are symmetrical, and the shifting mark is asymmetric to all of the first corner mark, the second corner mark and the third corner mark. The second panel is rotated 180 degrees relatively to the first panel, the first corner mark of the first panel is aligned to the third corner mark of the second panel, the third corner mark of the first panel is aligned to the first corner mark of the second panel, and the double layer panel is formed after laminating. The second corner mark of the first panel is aligned to the second corner mark of the third panel, the shifting mark of the first panel is aligned to the shifting mark of the third panel, and the triple layer panel is formed after laminating.

According to one aspect of the present disclosure, an alignment mark is disposed on a panel, and includes a first area and at least one second area. The first area is formed by surrounding via a plurality of boundaries. The second area is located in the first area, wherein the second area lets a light pass through, and the other area of the first area excepting from the second area prohibits the light from passing through. A distance between one of the boundaries of the first area and the second area is less than or equal to 0.02 mm.

DETAILED DESCRIPTION

Figure 1:
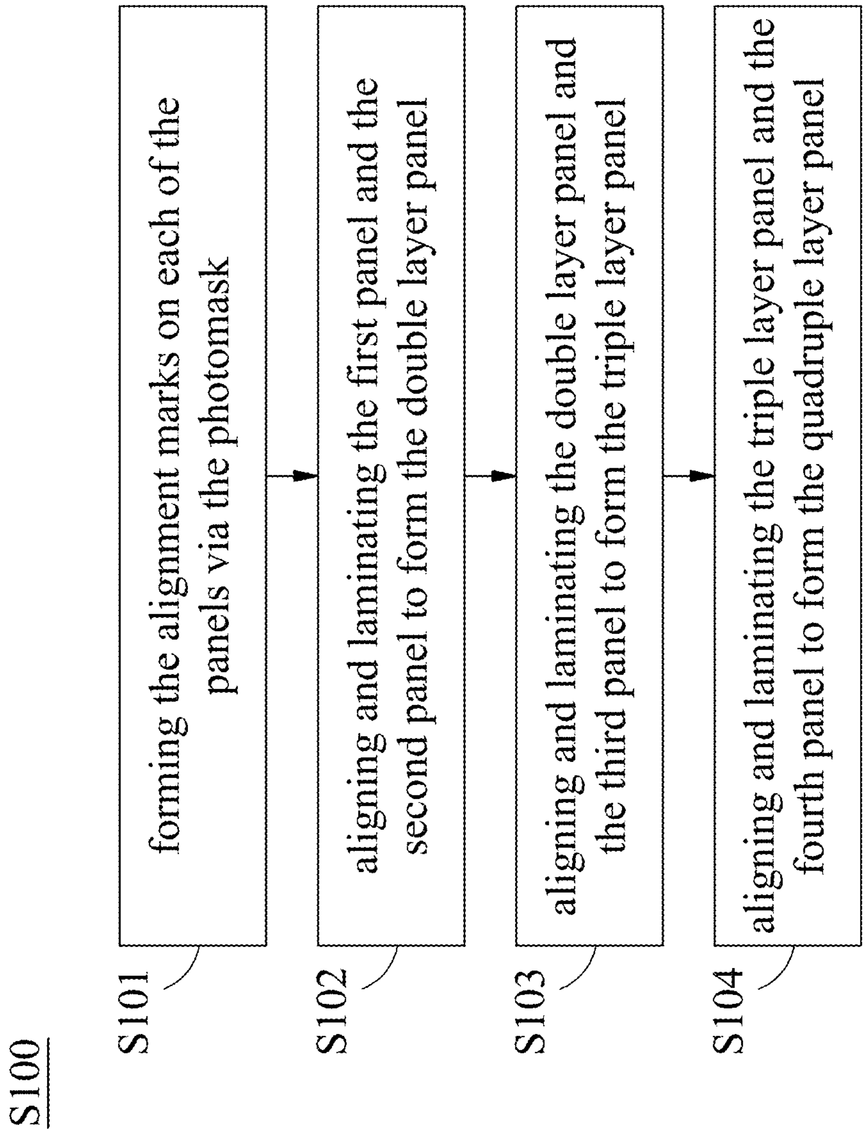
FIG. 1 is a step flow chart of a method of aligning and laminating for panels according to the example of the present disclosure.

FIG. 1 is a step flow chart of a method of aligning and laminating for panels according to the example of the present disclosure. In FIG. 1, the method S100 of aligning and laminating for the panels includes steps S101, S102, S103.

Figure 2:
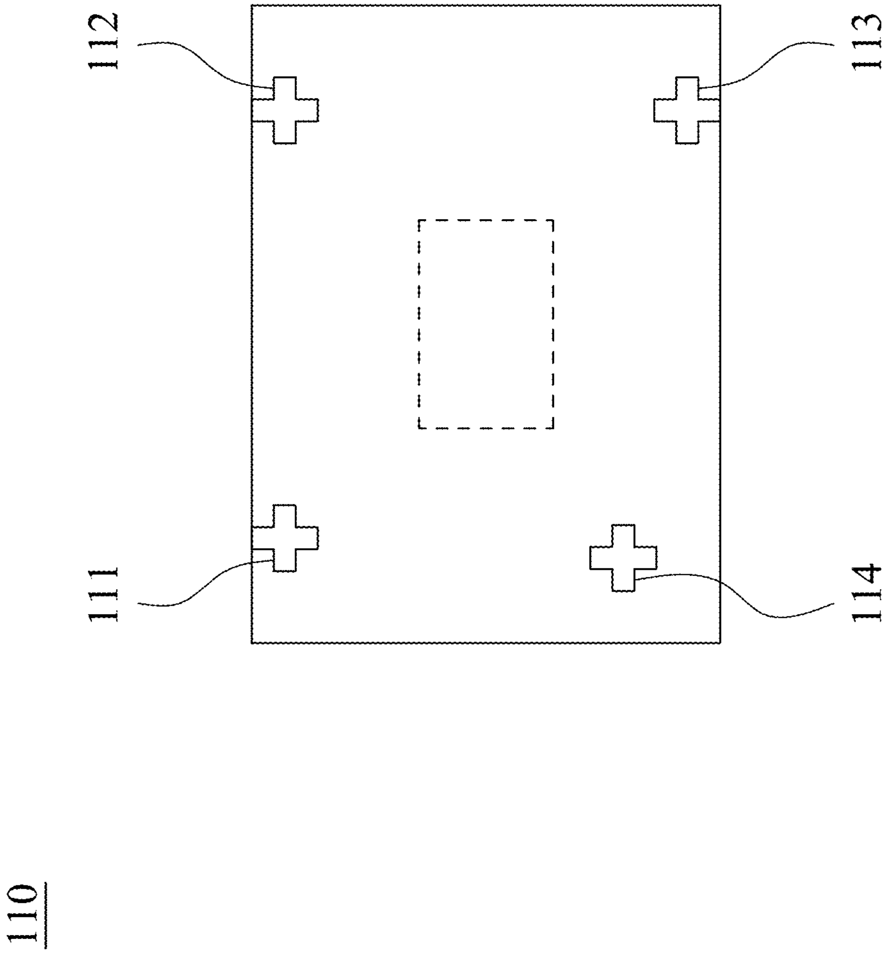
FIG. 2 is a schematic view of a photomask according to the example in FIG. 1.
Figure 3:
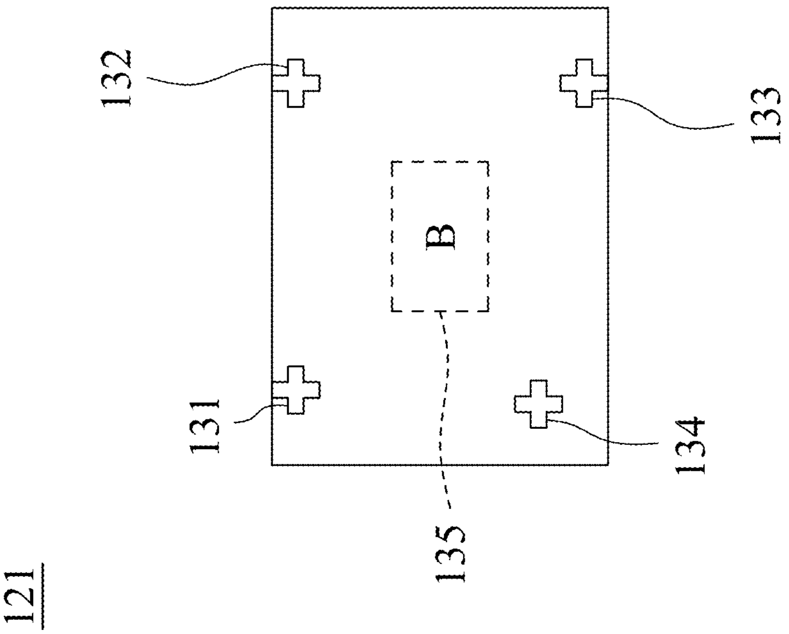
FIG. 3 is a schematic view of a first panel according to the example in FIG. 1.
Figure 4:
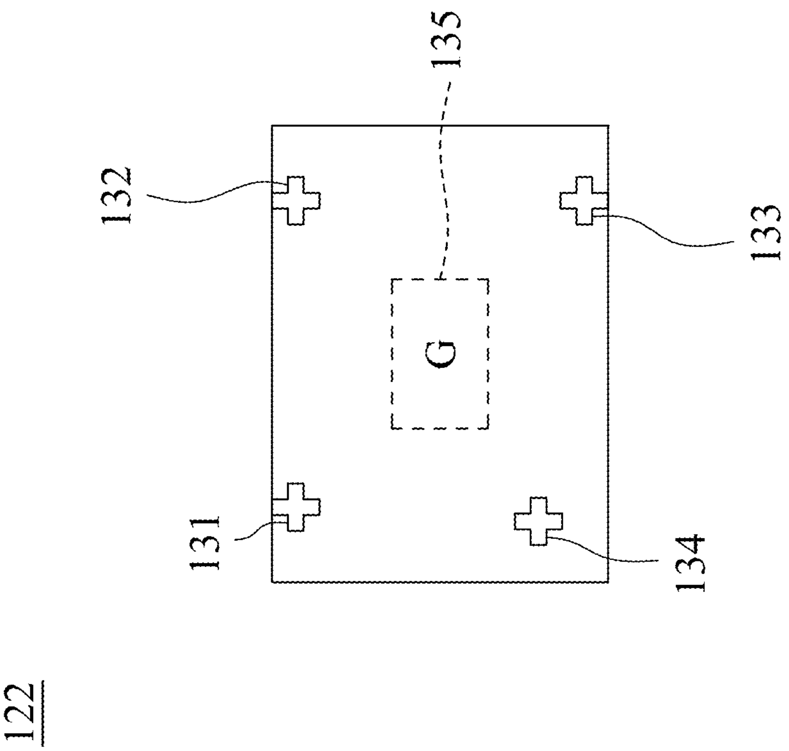
FIG. 4 is a schematic view of a second panel according to the example in FIG. 1.
Figure 5:
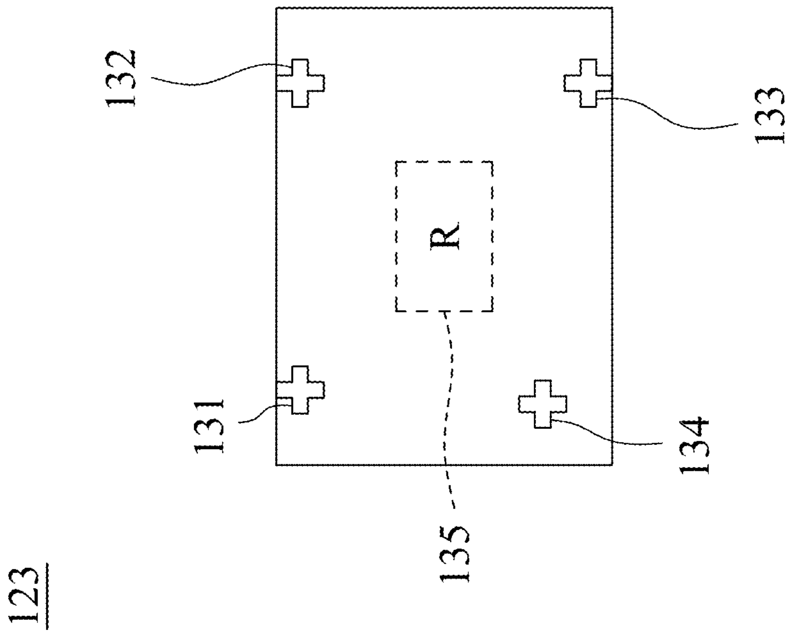
FIG. 5 is a schematic view of a third panel according to the example in FIG. 1.

FIG. 2 is a schematic view of a photomask according to the example in FIG. 1. FIG. 3 is a schematic view of a first panel according to the example in FIG. 1. FIG. 4 is a schematic view of a second panel according to the example in FIG. 1. FIG. 5 is a schematic view of a third panel according to the example in FIG. 1. In FIGS. 1 to 5, the step S101 includes forming four alignment marks on each of a plurality of the panels via the photomask 110, wherein the panels include the first panel 121, the second panel 122 and the third panel 123, the alignment marks are located on four corners of each of the panels (that is, the first panel 121, the second panel 122 and the third panel 123), respectively, and the alignment marks are a first corner mark 131, a second corner mark 132, a third corner mark 133 and a shifting mark 134.

Furthermore, the first corner mark 131 and the second corner mark 132 are symmetrical, and the second corner mark 132 and the third corner mark 133 are symmetrical, wherein the shifting mark 134 is asymmetric to all of the first corner mark 131, the second corner mark 132 and the third corner mark 133. In other words, the shifting mark 134 is shifted from the original position, which is symmetrical to the first corner mark 131 and the third corner mark 133.

Figure 6:
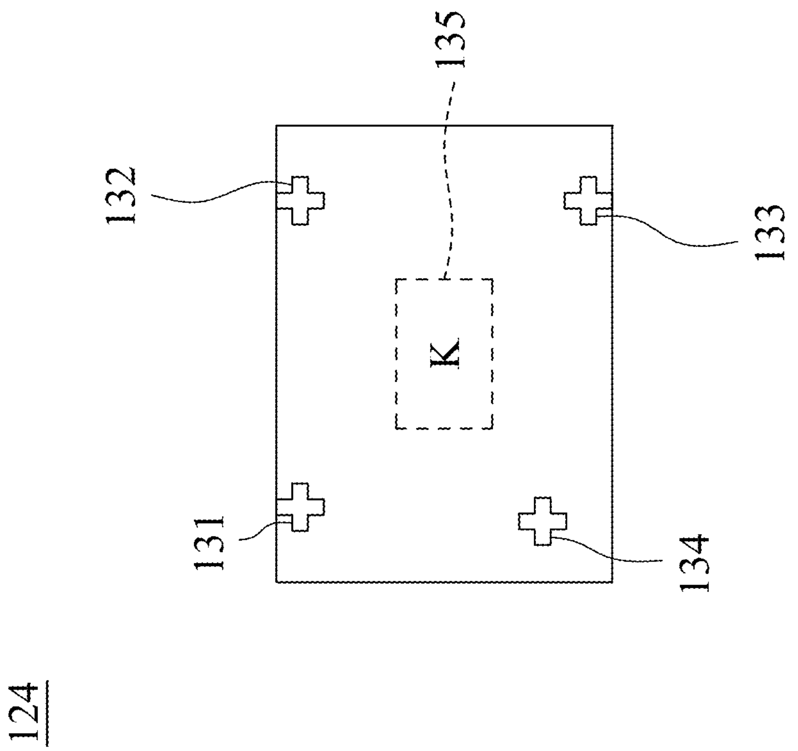
FIG. 6 is a schematic view of a fourth panel according to the example in FIG. 1.

FIG. 6 is a schematic view of a fourth panel according to the example in FIG. 1. In FIG. 6, the panels can further include the fourth panel 124, and the first corner mark 131, the second corner mark 132, the third corner mark 133 and the shifting mark 134 are located on four corners of the fourth panel 124. Moreover, each of the first panel 121, the second panel 122, the third panel 123 and the fourth panel 124 can be a cholesterol liquid panel, and the first panel 121, the second panel 122, the third panel 123 and the fourth panel 124 can be the panels of different colors, wherein the first panel 121 can be a blue cholesterol liquid panel, the second panel 122 can be a green cholesterol liquid panel, the third panel 123 can be a red cholesterol liquid panel, the fourth panel 124 can be a black cholesterol liquid panel, and B, G, R, K in FIGS. 3-6 are configured to indicate blue, green, red and black, respectively, but the present disclosure is not limited thereto. Further, each of the first panel 121, the second panel 122, the third panel 123 and the fourth panel 124 can be formed via a photolithography process.

In FIG. 2, a plurality of marks 111, 112, 113, 114 are disposed on the photomask 110, and the mark 114 is asymmetric to all of the marks 111, 112, 113, wherein the position of each of the marks 111, 112, 113, 114 is corresponding to the position of each of the first corner mark 131, the second corner mark 132, the third corner mark 133 and the shifting mark 134 of each of the first panel 121, the second panel 122, the third panel 123 and the fourth panel 124.

In FIGS. 3 to 6, each of the first panel 121, the second panel 122, the third panel 123 and the fourth panel 124 can include a display area 135, and each of the alignment marks (that is, the first corner mark 131, the second corner mark 132, the third corner mark 133 and the shifting mark 134) is located on an area outside of the display area 135.

Figure 7:
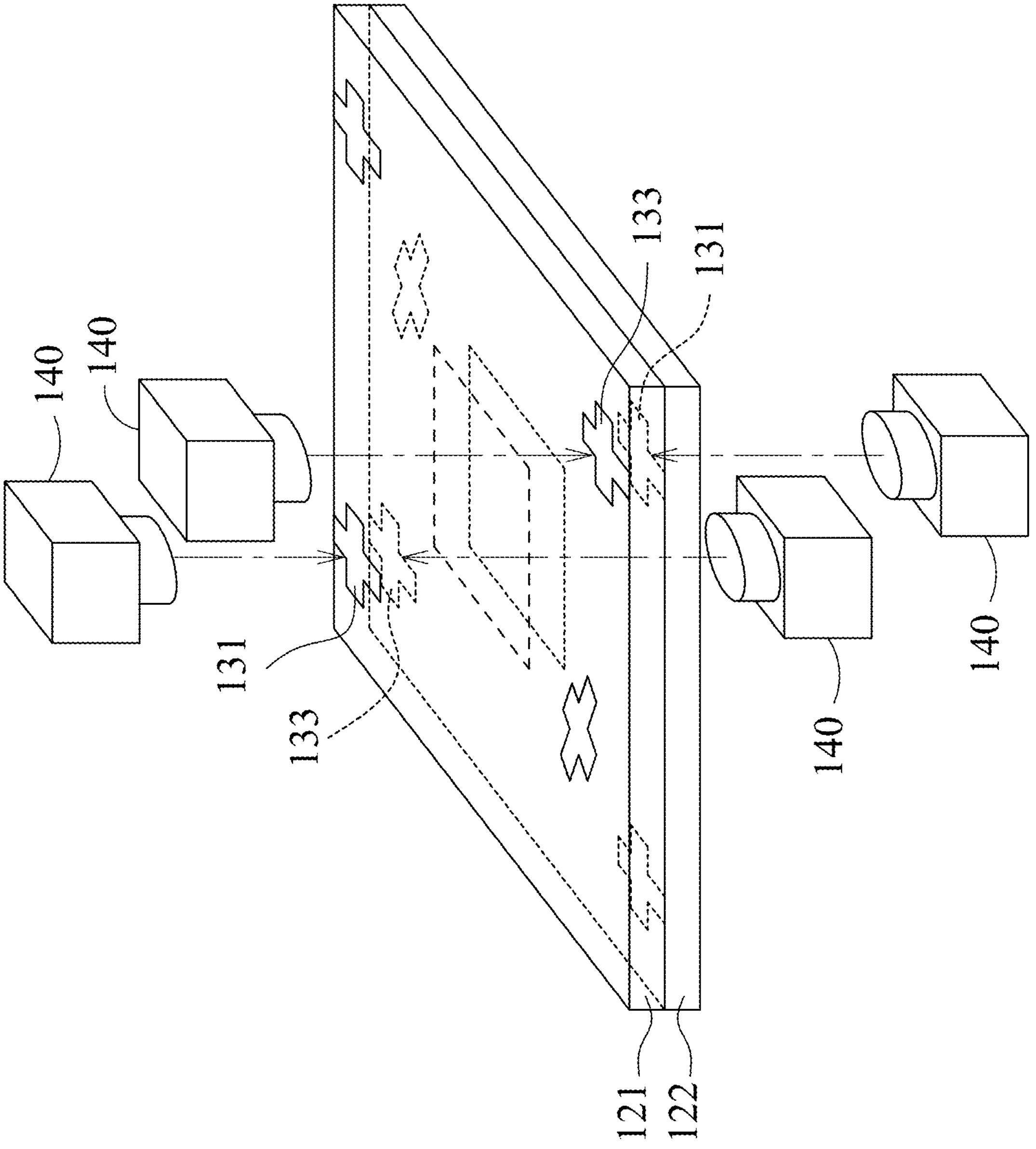
FIG. 7 is a schematic view of aligning and laminating the first panel and the second panel according to the example in FIG. 1.

FIG. 7 is a schematic view of aligning and laminating the first panel and the second panel according to the example in FIG. 1. In FIGS. 1 and 7, the step S102 includes aligning and laminating the first panel 121 and the second panel 122 to form a double layer panel, wherein the second panel 122 is rotated 180 degrees relatively to the first panel 121, the first corner mark 131 of the first panel 121 is aligned to the third corner mark 133 of the second panel 122, the third corner mark 133 of the first panel 121 is aligned to the first corner mark 131 of the second panel 122, and the double layer panel is formed after laminating.

Figure 8:
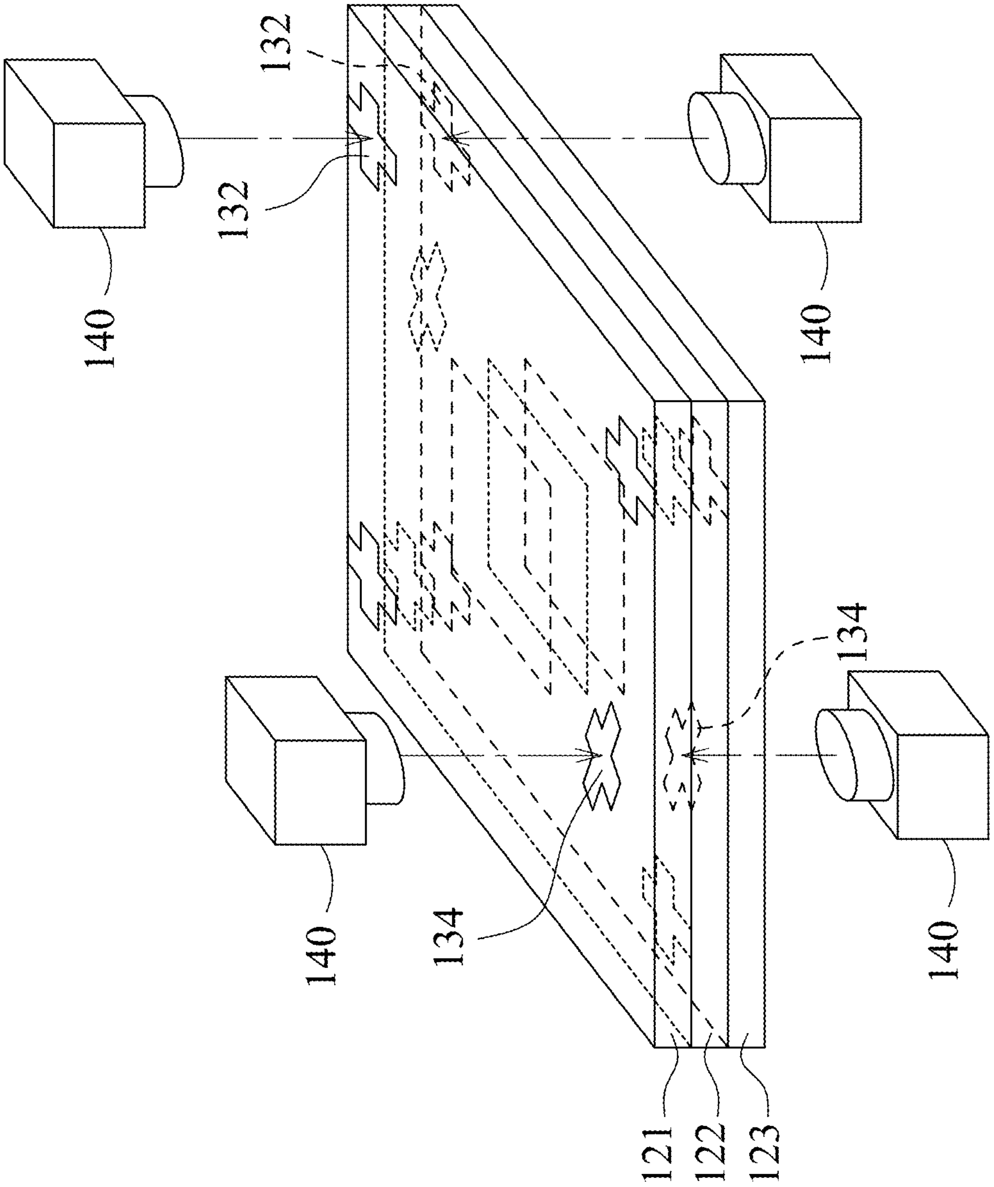
FIG. 8 is a schematic view of aligning and laminating the double layer panel and the third panel according to the example in FIG. 1.

FIG. 8 is a schematic view of aligning and laminating the double layer panel and the third panel according to the example in FIG. 1. In FIGS. 1 and 8, the step S103 includes aligning and laminating the double layer panel and the third panel 123 to form a triple layer panel, wherein the second corner mark 132 of the first panel 121 is aligned to the second corner mark 132 of the third panel 123, the shifting mark 134 of the first panel 121 is aligned to the shifting mark 134 of the third panel 123, and the triple layer panel is formed after laminating. It should be mentioned that the alignment of the second corner mark 132 of the first panel 121 and the second corner mark 132 of the third panel 123 is not influenced and interfered by the shifting mark 134 of the second panel 122, and the alignment of the shifting mark 134 of the first panel 121 and the shifting mark 134 of the third panel 123 is not influenced and interfered by the second corner mark 132 of the second panel 122.

Figure 9:
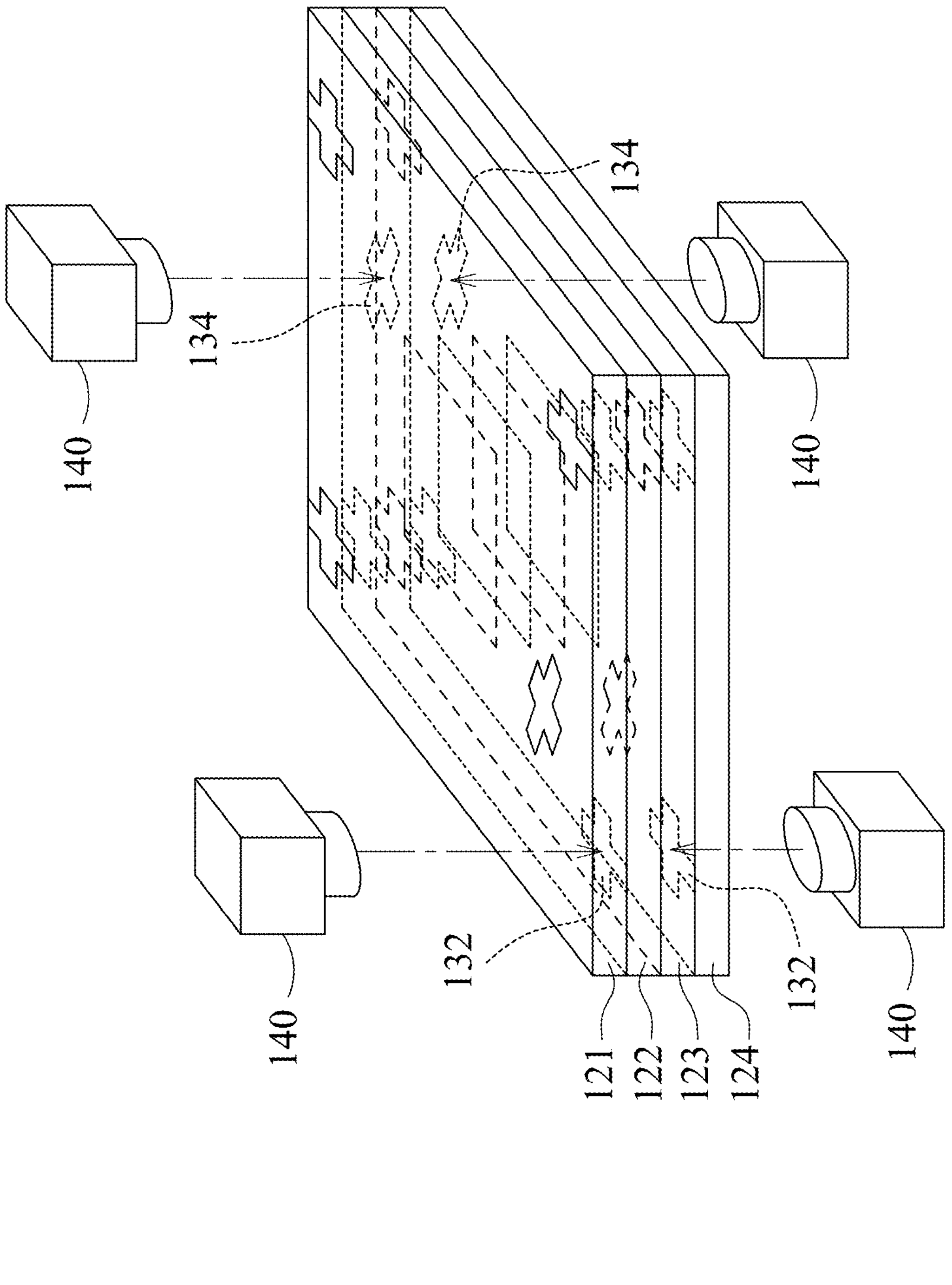
FIG. 9 is a schematic view of aligning and laminating the triple layer panel and the fourth panel according to the example in FIG. 1.

FIG. 9 is a schematic view of aligning and laminating the triple layer panel and the fourth panel according to the example in FIG. 1. In FIGS. 1 and 9, the method S100 of aligning and laminating for the panels can further include a step S104, and the step S104 includes aligning and laminating the triple layer panel and the fourth panel 124 to form a quadruple layer panel, wherein the fourth panel 124 is rotated 180 degrees relatively to the first panel 121 and the third panel 123, the shifting mark 134 of the second panel 122 is aligned to the shifting mark 134 of the fourth panel 124, the second corner mark 132 of the second panel 122 is aligned to the second corner mark 132 of the fourth panel 124, and the quadruple layer panel is formed after laminating. It should be mentioned that the alignment of the shifting mark 134 of the second panel 122 and the shifting mark 134 of the fourth panel 124 is not influenced and interfered by the second corner mark 132 of the first panel 121 and the second corner mark 132 of the third panel 123, and the alignment of the second corner mark 132 of the second panel 122 and the second corner mark 132 of the fourth panel 124 is not influenced and interfered by the shifting mark 134 of the first panel 121 and the shifting mark 134 of the third panel 123.

In FIGS. 7 to 9, at least two cameras 140 can be configured to capture in aligning and laminating the first panel 121 and the second panel 122 to form the double layer panel, aligning and laminating the double layer panel and the third panel 123 to form the triple layer panel and aligning and laminating the triple layer panel and the fourth panel 124 to form the quadruple layer panel, and the cameras 140 are simultaneously disposed above or below the double layer panel, the triple layer panel and the quadruple layer panel. Furthermore, a number of the cameras 140 can be four, two of the cameras 140 are disposed above the double layer panel, the triple layer panel and the quadruple layer panel, and the other two of the cameras 140 are disposed below the double layer panel, the triple layer panel and the quadruple layer panel. It should be mentioned that the number of the cameras 140 can be corresponding to the manufacturing requirement, and the present disclosure is not limited thereto.

Furthermore, a laminating sequence of the first panel 121, the second panel 122, the third panel 123 and the fourth panel 124 can be from top to bottom or from bottom to top, and a thickness of each of the first panel 121, the second panel 122, the third panel 123 and the fourth panel 124 can be between 0.2 mm and 0.5 mm, and an area of each of the first panel 121, the second panel 122, the third panel 123 and the fourth panel 124 can be between 13.3 inch and 27.6 inch, but the present disclosure is not limited thereto.

It should be mentioned that the shifting marks 134 in FIGS. 7 to 9 are presented in X-shaped and highlighted the shifting positions thereof for emphasizing the other marks (that is, the first corner marks 131, the second corner marks 132 and the third corner marks 133) are not influenced via the shifting marks 134 or do not influence the shifting marks 134 during aligning and laminating. In actual, the shifting marks 134 are the same as the first corner marks 131, the second corner marks 132 and the third corner marks 133 as cross-shaped on the panels, as shown in the schematic views of FIGS. 3 to 6. Further, the shifting marks 134 can be X-shaped shown as FIGS. 7 to 9 or the shape different from the shape of each of the first corner marks 131, the second corner marks 132 and the third corner marks 133. That is, a shape of the shifting mark 134 of each of the panels can be different from a shape of each of the first corner mark 131, the second corner mark 132 and the third corner mark 133 of each of the panels, so that the effect of avoiding the shifting marks 134 influenced via the other marks or influencing the other marks during aligning and laminating can be achieved.

Figure 10:
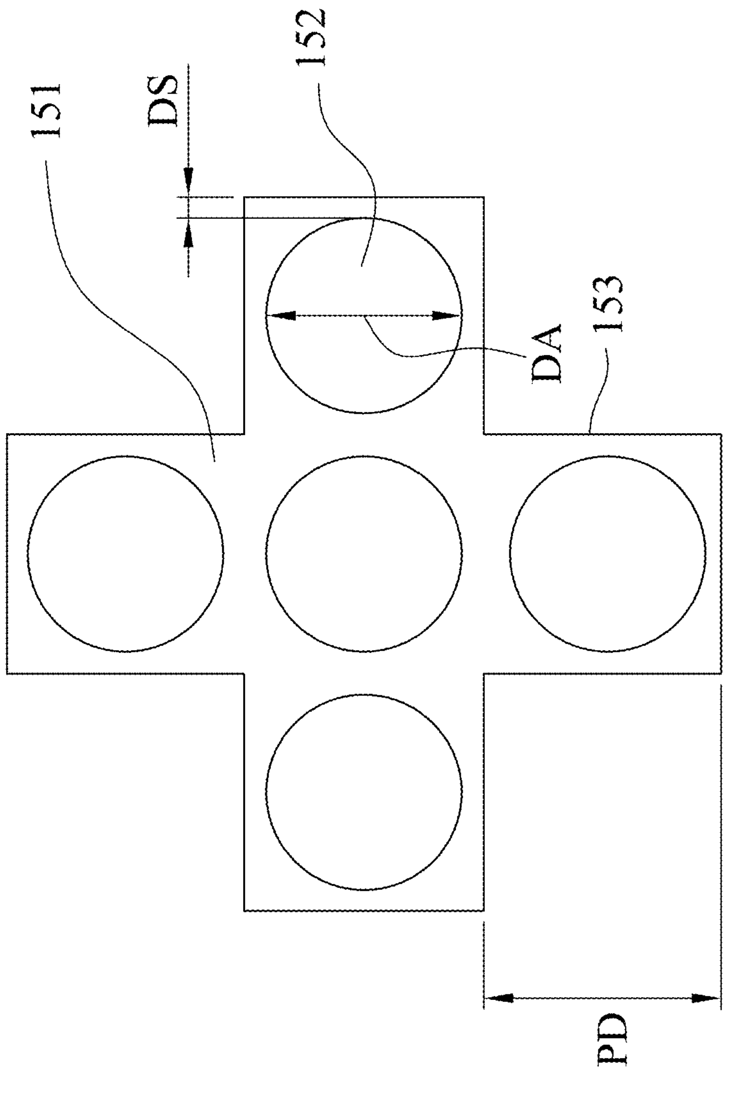
FIG. 10 is a schematic view of an alignment mark according to the example in FIG. 1.

FIG. 10 is a schematic view of an alignment mark according to the example in FIG. 1. In FIG. 10, the alignment mark (its reference numeral is omitted) includes a first area 151 and a plurality of second areas 152, the first area 151 is formed by surrounding via a plurality of boundaries 153, and the second areas 152 are located in the first area 151, wherein the second areas 152 let a light pass through, and the other area of the first area 151 excepting from the second areas 152 prohibit the light from passing through. Moreover, a distance DS between one of the boundaries 153 of the first area 151 and one of the second areas 152 is less than or equal to 0.02 mm, wherein the distance DS between one of the boundaries 153 of the first area 151 and one of the second areas 152 can be between 0.01 mm and 0.02 mm. Further, the alignment mark is disposed on a panel. In particular, the coaxial light source can be avoided being entirely blocked to pass through from the alignment mark.

In detail, the alignment mark in FIG. 10 can be each of the first corner mark 131, the second corner mark 132, the third corner mark 133 and the shifting mark 134 of each of the first panel 121, the second panel 122, the third panel 123 and the fourth panel 124 and each of the marks 111, 112, 113, 114 of the photomask 110.

The first area 151 can be made of metal, and a length PD of each of the boundaries 153 can be less than or equal to 0.18 mm, wherein a number of the boundaries 153 of the first area 151 can be plurality, and the length PD of each of the boundaries 153 can be the same. In particular, the aforementioned values are based on the capabilities of the exposure process, the development process and the etching process of the lithography process, and the aforementioned values are also related to the lens magnification and the field of view, which can be provided, of each of the cameras 140.

A number of the second areas 152 can be five, wherein the second areas 152 are located on four corners and a center position of the alignment mark, respectively. Further, the first area 151 can be cross-shaped, each of the second areas 152 can be circle, and a diameter DA of each of the second areas 152 can be less than 0.18 mm, but the present disclosure is not limited to the aforementioned number and shape.

In FIG. 10, the distance DS between one of the boundaries 153 of the first area 151 and one of the second areas 152 is 0.015 mm, the diameter DA of each of the second areas 152 is 0.15 mm, and the length PD of each of the boundaries 153 is 0.18 mm.

In summary, the method of aligning and laminating for the panels of the present disclosure is favorable for achieving the effect of forming four panels via the same photomask and accurately laminating and aligning the panels, wherein the alignment marks at the diagonal of each panel do not interfere with the alignment during aligning and laminating, and the method of aligning and laminating for the panels can be applied to different panel sizes of the panels. Therefore, the processes and the manufacturing cost can be reduced, and the problems of damaging or polluting the panels via the photomask can be solved. Further, the effect of the alignment can be further enhanced via the alignment mark of the present disclosure, and the clear image of the alignment marks can be captured via the cameras for obtaining the accurate alignment to process the aligning process and the laminating process.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:

1. A method of aligning and laminating for panels, comprising:

forming four alignment marks on each of a plurality of the panels via a photomask, wherein the panels comprise a first panel, a second panel and a third panel, the four alignment marks are located on four corners of each of the panels, respectively, the four alignment marks are a first corner mark, a second corner mark, a third corner mark and a shifting mark, the first corner mark and the second corner mark are symmetrical, the second corner mark and the third corner mark are symmetrical, and the shifting mark is asymmetric to all of the first corner mark, the second corner mark and the third corner mark;

aligning and laminating the first panel and the second panel to form a double layer panel, wherein the second panel is rotated 180 degrees relatively to the first panel, the first corner mark of the first panel is aligned to the third corner mark of the second panel, the third corner mark of the first panel is aligned to the first corner mark of the second panel, and the double layer panel is formed after laminating; and aligning and laminating the double layer panel and the third panel to form a triple layer panel, wherein the second corner mark of the first panel is aligned to the second corner mark of the third panel, the shifting mark of the first panel is aligned to the shifting mark of the third panel, and the triple layer panel is formed after laminating.

2. The method of aligning and laminating for the panels of claim 1, wherein the panels further comprise a fourth panel in forming the four alignment marks on each of the panels via the photomask.

3. The method of aligning and laminating for the panels of claim 2, further comprising:

aligning and laminating the triple layer panel and the fourth panel to form a quadruple layer panel, wherein the fourth panel is rotated 180 degrees relatively to the first panel and the third panel, the shifting mark of the second panel is aligned to the shifting mark of the fourth panel, the second corner mark of the second panel is aligned to the second corner mark of the fourth panel, and the quadruple layer panel is formed after laminating.

4. The method of aligning and laminating for the panels of claim 3, wherein at least two cameras are configured to capture in aligning and laminating the first panel and the second panel to form the double layer panel, aligning and laminating the double layer panel and the third panel to form the triple layer panel and aligning and laminating the triple layer panel and the fourth panel to form the quadruple layer panel, and the at least two cameras are simultaneously disposed above or below the double layer panel, the triple layer panel and the quadruple layer panel.

5. The method of aligning and laminating for the panels of claim 4, wherein a number of the at least two cameras is four, two of the four cameras are disposed above the double layer panel, the triple layer panel and the quadruple layer panel, and the other two of the four cameras are disposed below the double layer panel, the triple layer panel and the quadruple layer panel.

6. The method of aligning and laminating for the panels of claim 2, wherein each of the first panel, the second panel, the third panel and the fourth panel is a cholesterol liquid panel.

7. The method of aligning and laminating for the panels of claim 2, wherein the first panel, the second panel, the third panel and the fourth panel are the panels of different colors.

8. The method of aligning and laminating for the panels of claim 7, wherein the first panel is a blue cholesterol liquid panel, the second panel is a green cholesterol liquid panel, the third panel is a red cholesterol liquid panel, and the fourth panel is a black cholesterol liquid panel.

9. The method of aligning and laminating for the panels of claim 2, wherein each of the first panel, the second panel, the third panel and the fourth panel comprises a display area, and each of the four alignment marks is located on an area outside of the display area.

10. The method of aligning and laminating for the panels of claim 2, wherein each of the first panel, the second panel, the third panel and the fourth panel is formed via a photolithography process.

11. The method of aligning and laminating for the panels of claim 1, wherein a shape of the shifting mark of each of the panels is different from a shape of each of the first corner mark, the second corner mark and the third corner mark of each of the panels.

* * * * *